(12) United States Patent
Chien et al.

(10) Patent No.: US 6,169,016 B1
(45) Date of Patent: Jan. 2, 2001

(54) METHOD OF FORMING CONTACT

(75) Inventors: Sun-Chieh Chien, Hsinchu; J. S. Jason Jenq, Pingtung, both of (TW)

(73) Assignee: United Microelectronics Corp. (TW)

( * ) Notice: Under 35 U.S.C. 154(b), the term of this patent shall be extended for 0 days.

(21) Appl. No.: 09/181,302

(22) Filed: Oct. 28, 1998

(51) Int. Cl.[7] .................................................. H01L 21/425
(52) U.S. Cl. ............................................ 438/533; 438/533
(58) Field of Search .............................. 438/99, 233, 533, 438/571, 586, 584, 227, 488, 659, 660, 669

(56) References Cited

U.S. PATENT DOCUMENTS

| | | | |
|---|---|---|---|
| 5,341,014 | * 8/1994 | Fujii et al. | 438/233 |
| 5,510,296 | * 4/1996 | Yen et al. | 438/649 |
| 5,589,415 | * 12/1996 | Blanchard | 438/128 |
| 5,652,183 | * 7/1997 | Fujii | 438/621 |

* cited by examiner

Primary Examiner—David Nelms
Assistant Examiner—Dung A Le
(74) Attorney, Agent, or Firm—Thomas, Kayden, Horstemeyer & Risley, L.L.P.

(57) ABSTRACT

A method of forming contacts is provided. A thin polysilicon layer with a thickness of about 200–400 Å is deposited after forming a contact opening in a substrate. Then, the polysilicon layer is heavily doped using ion implantation to increase the number of mobile carriers in the polysilicon and to destroy the thin oxide layer formed naturally on the substrate, which destruction enhances the contact between the substrate and the polysilicon. A thick polysilicon layer is deposited on the thin polysilicon to form a bit line contact and a node contact.

12 Claims, 4 Drawing Sheets

METHOD OF FORMING CONTACT

BACKGROUND OF THE INVENTION

1. Field of the Invention

The invention relates in general to the fabrication of semiconductor integrated circuits (ICs), and more particularly to a method of forming bit-line contacts and node contact using a thin doped polysilicon layer.

2. Description of the Related Art

Modern semiconductor fabrication technique in a very large scale integration (VLSI) highly increases the circuit density on a chip. The increase in circuit density causes the downsizing of devices and increases device packing density. Recently, enhanced resolution of photolithography technique, for example, using phase shifting masks and self-aligning processes have all been advantageous to downsizing devices and increasing density. Minimum device size is smaller than one micrometer and there are over a million transistors on a chip in ultra large scale integration (ULSI). However, as technology develops towards an even higher circuit density, some problems develop in semiconductor fabrication. One such problem high resistivity due to a short distance between a bit line contact and a node contact in a dynamic random access memory (DRAM).

In FIGS. 1A to 1D, a conventional method of forming a bit line contact and a node contact is shown.

FIG. 1A illustrates formation of metal oxide semiconductors formed on a semiconductor substrate 100. The metal oxide semiconductors comprise gates 110a and 110b, a source/drain region 112a between the gates 110a, and source/drain regions 112b between the gates 110a and 110b. Each of the gates 110a and 110b respectively includes a first doped polysilicon layer 102 with a thickness of about 1000 Å on the bottom of the gates 110, a first tungsten silicide layer 104 with a thickness of about 1000 Å on the first doped polysilicon layer 102, a silicon nitride layer 106 with a thickness of about 1500 Å on the first tungsten silicide layer 102, and a spacer 108 formed around the first doped polysilicon layer 102, the tungsten silicide layer 104 and the silicon nitride layer 106. The material of the spacer 108 is silicon nitride which can protect the gates 110a and 110b.

FIG. 1B illustrates deposition of a second doped polysilicon layer 114 with a thickness of about 1000 Å on the gates 110a and the source/drain regions 112a. Then, a second tungsten silicide layer 116 with a thickness of about 1000 Å is deposited on the second doped polysilicon layer 114. The second tungsten silicide layer 116 and the second doped polysilicon layer 114 are converted to a bit line contact 117 by a photolithography step.

FIG. 1C illustrates deposition of a dielectric layer 118 on the gates 110a and 110b, the bit line contact 117, and the semiconductor substrate 100. A photosensitive pattern (not shown) is defined on the dielectric layer 118. Then, the dielectric layer 118 not covered by the photosensitive pattern is etched anisotropically to form a via opening 120 on the source/drain regions 112b and to expose the top surface of the source/drain regions 112b.

FIG. 1D illustrates deposition of a third doped polysilicon layer 122 with a thickness of about 6000–10000 Å on the dielectric layer 118. The third doped polysilicon layer 122 fills the via opening 120. Part of the third doped polysilicon layer 122 is removed to form a node contact 120a to the source/drain region 112b by photolithography and etching. A hemi-spherical grain (HSG) layer 124 is formed on the surface of the node contact 120a salient to the dielectric layer 118. Then, a thin ONO film 125 is formed on the HSG layer 124. A fourth doped polysilicon layer 126 with a thickness of about 1000 Å is deposited and etched over the ONO layer 125.

The line width of the bit line contact and of the node contact formed by a conventional technique satisfies process requirements. The RC delay tome can be decreased by inhibiting bit line sheet resistance and resistivity of the bit line contact and of the node contact from the first, second, third and fourth doped polysilicon layers 102, 114, 122 and 126. However, when the lien width achieves 0.25 µm or less for highly integrated circuits and the width of the bit line contact and of the node contact is 0.1 µm, resistivity of these contacts is till high, Furthermore, a thin oxide film is naturally formed on the substrate surface, the oxide film prevents polysilicon deposited in the contacts from adequately making contact with the substrate. So conventional methods obviously cannot satisfy process requirements. Developing a technique which can provide lower resistivity of bit line contacts and node contacts is of great importance for the industry.

SUMMARY OF THE INVENTION

It is therefor the major object of the invention to provide an improved contact method of forming contacts. The contacts provided from this invention increases contact sheet resistance to satisfy process requirements. Furthermore, the method of forming contacts not only enhances conductivity by increasing mobile carriers in the contacts, but also destroys the naturally formed thin oxide layer in the substrate surface. This enhances the contact between the polysilicon and the substrate.

The invention achieves the above-identified objects by providing a method of forming contacts, wherein the contacts comprises bit line contact and node contacts. First, a substrate is provided. Gates are formed on the substrate, and source/drain regions are formed in the substrate. Each gate comprises a first polysilicon layer, a tungsten silicide layer, a silicon nitride layer and a spacer formed around these layers. Then, a second polysilicon layer with a thickness of about 22–400 Å is deposited on the substrate and the gates. An ion implantation with an energy of about 20–30 Kev is performed to dope ions with a concentration of about 2E15-4E15 into the second polysilicon layer. A third doped polysilicon layer and a tungsten silicide layer are deposited sequentially on the second polysilicon layer. The second polysilicon layer, the third polysilicon layer and the tungsten silicide layer are partially removed by etching to form a bit line contact to a source/drain region between gates. A dielectric layer with a thickness of about 5000 Å is deposited over the entire surface. A via opening to another source/drain region adjacent to the bit line contact is formed by etching the dielectric layer after chemical mechanical polishing (CMP). A fourth polysilicon layer with a thickness of about 200–400 Å and comprising a dopant with a concentration of about 2E15-4E15 is deposited with an energy of about 20–30 Kev. A fifth doped polysilicon layer with a thickness of about 6000–10000 Å is deposited on the fourth polysilicon layer. The fourth and fifth polysilicon layers are partially removed to form a node contact to the source/drain region adjacent the bit line contact by photolithography and etching. Furthermore, a HGS layer, an ONO layer and a sixth polysilicon layer are formed on the node contact surface by a conventional technique.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
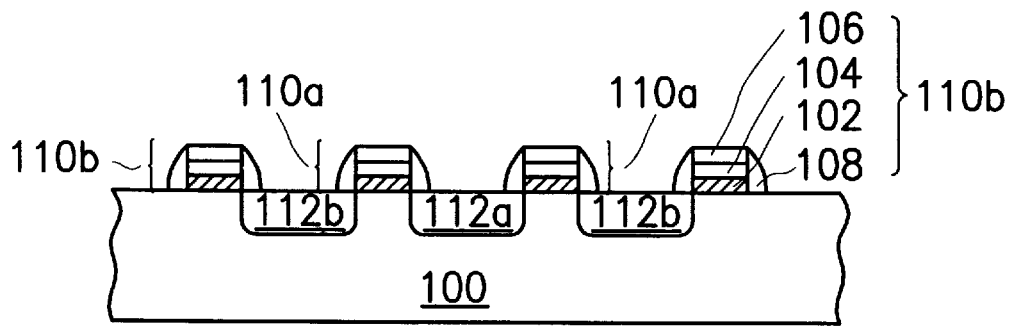
FIGS. 1A to 1D are cross-sectional views showing conventional process steps of forming a bit line contact and an node contact.
Figure 1B:
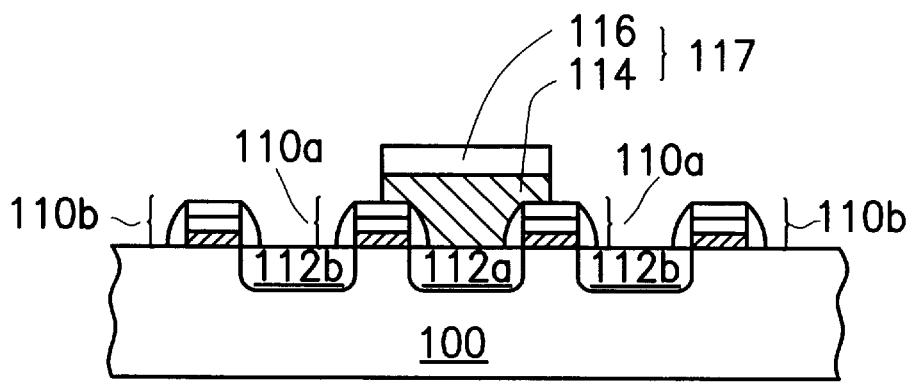
Figure 1C:
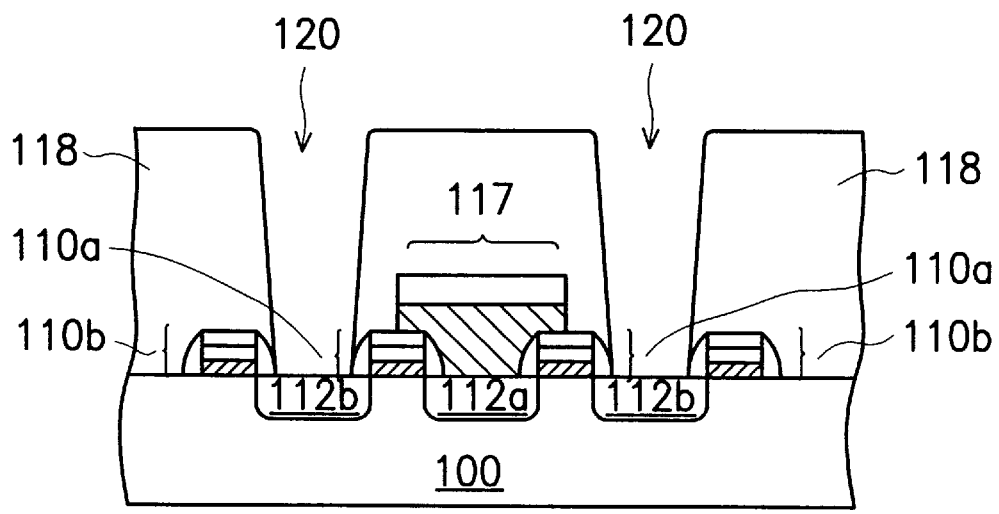
Figure 1D:
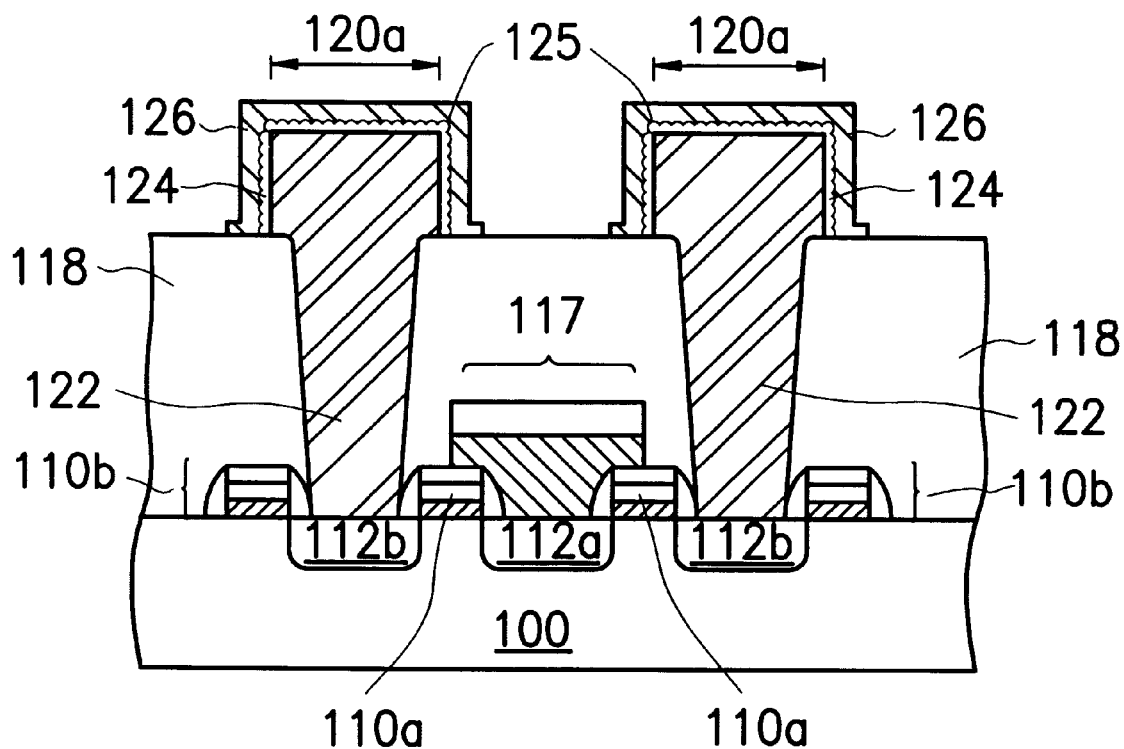
Figure 2A:
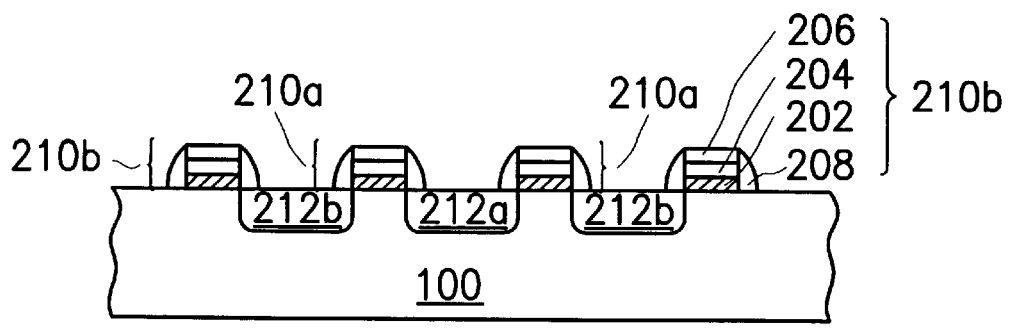
FIGS. 2A to 2D are cross-sectional views showing the process steps of one preferred embodiment of the improved method of forming a bit line contact and a node contact.

As shown in FIG. 2A, a semiconductor substrate 200 comprising gates 210a and 210b and source/drain regions 212a and 212b thereon is provided. Each of the gates 210a and 210b includes a first doped polysilicon layer 202 with a thickness of about 1000 Å on the substrate 200, a tungsten silicide layer 204 with a thickness of about 1000 Å on the first doped polysilicon layer 202, a silicon nitride layer 206 with a thickness of about 1500 Å on the tungsten silicide layer 204 and a spacer 208 consisting of silicon nitride formed around the first doped polysilicon layer, the tungsten silicide layer and the silicon nitride layer. The spacer 208 can protect the gates 210a and 210b.

Figure 2B:
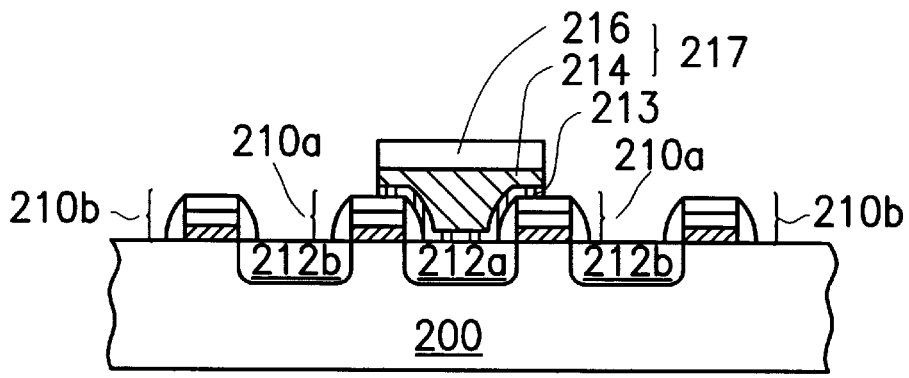

FIG. 2B illustrates deposition of a thin second polysilicon layer 213 on the gates 210a and the source/drain regions 212a. This second polysilicon layer 213 has a thickness of about 200–400 Å. Then, ions having a concentration about 2E15-4E15 are doped into the second polysilicon layer 213 by using an energy about 20–30 keV. This step increases mobile carriers in the second polysilicon layer 213 to enhance the electric conductivity and decrease the resistivity, Formation of a thin oxide film on the substrate 200 destroys the thin oxide film, thereby improving contact between the substrate 200 and the second polysilicon layer 213. A doped third polysilicon layer 214 and a tungsten silicide layer 216 with a thickness of about 1000 Å are sequentially deposited on the second polysilicon layer 213. Then, a bit line contact 217 to the source/drain regions 212a between the gates 210a is formed by partially etching the second polysilicon layer 213, the third polysilicon layer 214 and the tungsten silicide layer 217.

Figure 2C:
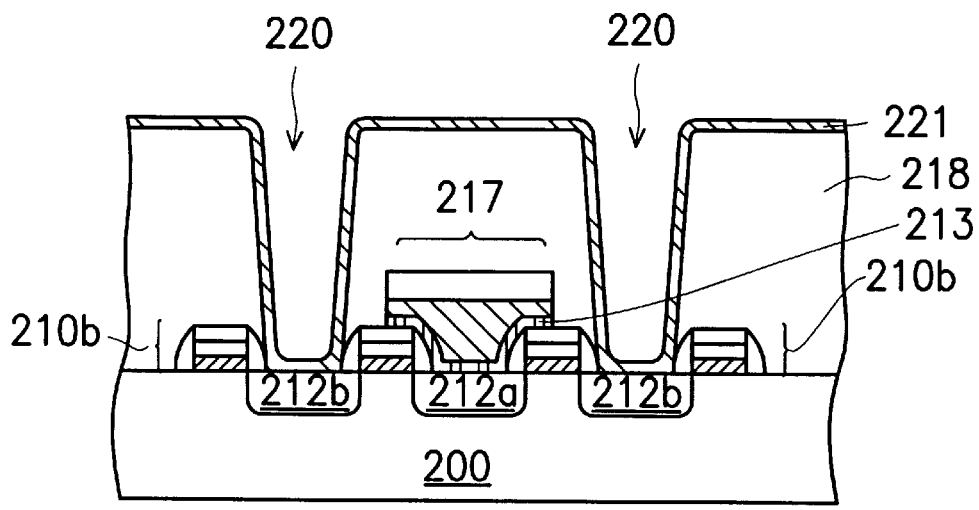

Next, FIG. 2C illustrates deposition of a dielectric layer 218 having a thickness of about 5000 Å. Dielectric layer 218 is planarized by chemical mechanical polishing (CMP). A via 220 to the source/drain region 212b and adjacent to the bit line contact 217 is formed in the dielectric layer 218 by using photolithography and etching processes. A thin fourth polysilicon layer 221 is deposited on the dielectric layer surface 218. Ions having a concentration about 2E15-4E15 are doped into the second polysilicon layer 221 by using an energy of about 20–30 keV. This step can increase mobile carriers in the second polysilicon layer 221 to enhance the electric conductivity and decrease the resistivity. If there is a thin oxide film on the substrate 200, this step can destroy the thin oxide film to improve the contact between the substrate 200 and the second polysilicon layer 221.

Figure 2D:
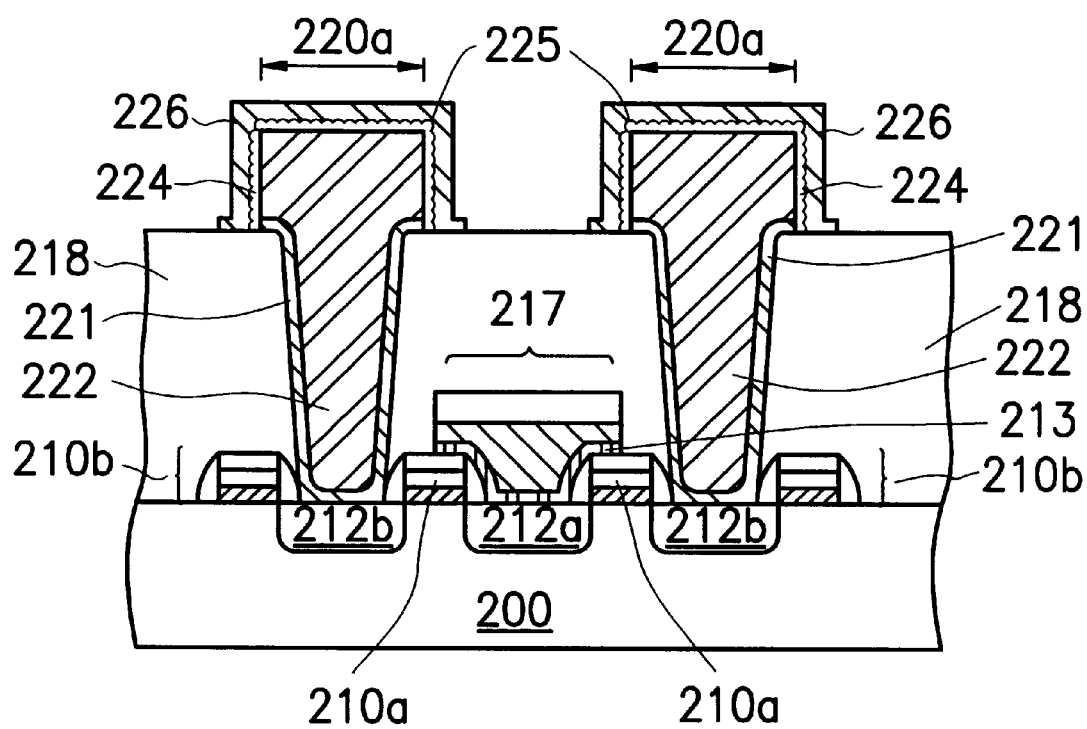

FIG. 2D illustrated deposition of a fifth doped polysilicon layer 222 having a thickness of about 6000–10000 Å on the fourth polysilicon layer 221. The via 220 is filled by the fifth doped polysilicon layer 222. The thin fourth polysilicon layer 221 and the fifth doped polysilicon layer 222 are partially removed to form a node contact 220a to the source/drain region 212b by using photolithography and etching processes. Them an HSG layer 224 is formed on the node contact 220a to increase the surface area. An ONO layer 225 is formed on the HSG layer 222 surface. A sixth polysilicon layer 226 is deposited and etched on the ONO layer 225 and the dielectric layer 218.

One feature of the invention is that the bit line contact and the node contact comprise doped polysilicon, which has more mobile carriers and can enhance the polysilicon layers' electric conductivity to decrease the contact sheet resistivity and to achieve the present requirements.

Another feature of the invention is the destruction of the thin oxide film that forms naturally on the substrate. This is accomplished by doping heavily into the polysilicon to increase the contact between the substrate and the contacts and to decrease the electric resistivity.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming contact, used on a substrate having gates formed thereon and source/drain regions in the substrate and beside the gates, wherein one of the source/drain regions is used as a common source/drain region between the gates, the method comprising the steps of:

forming a dielectric layer on the substrate and the gates;

respectively forming a contact opening in the dielectric layer to each of the source/drain regions;

forming a first polysilicon layer on the contact opening window surface and on the dielectric layer;

performing an ion implantation process with an energy in a range of 20–30 KeV;

forming a lightly doped, second polysilicon layer on the first polysilicon layer and in the contact opening and without first performing a native oxide removing process; and defining the first polysilicon layer and the second polysilicon layer and leaving the first polysilicon layer and the second polysilicon layer in the contact opening to form a contact.

2. The method according to claim 1, wherein each of the gates further comprises a spacer on the sidewall of each of the gates.

3. The method according to claim 1, wherein the first polysilicon layer has a thickness of about 200–400 Å.

4. The method according to claim 1, wherein the step of heavily doping ions into the first polysilicon layer is performed using energy about 20 keV–30 keV with a concentration of abut 2E15-4E15.

5. The method according to claim 1, wherein the ions comprise P-type ions.

6. The method according to claim 1, wherein the ions comprise N-type ions.

7. The method according to claim 1, wherein the contact comprises a node contact.

8. A method of forming a contact, comprising the steps of:

providing a substrate comprising gates formed thereon and source/drain regions in the substrate and beside the gates, wherein one of the source/drain regions is used as a common source/drain region between the gates and the substrate and the gates together construct a contact opening;

forming a first polysilicon layer over the gates and the source/drain regions;

performing an ion implantation process with an energy in a range of 20–30 KeV;

forming a lightly doped, second polysilicon layer on the first polysilicon layer and in the contact opening and without first performing a native oxide removing process;

forming a tungsten silicide layer on the second polysilicon layer; and defining the first polysilicon layer and the second polysilicon layer and the tungsten silicide layer, and leaving the first polysilicon layer and the second polysilicon layer and the tungsten silicide layer in the contact opening to form a contact.

9. The method according to claim 8, wherein the step of heavily doping ions into the first polysilicon layer is performed using energy about 20 keV–30 keV and the ions have a concentration of 2E15-4E15.

10. The method according to claim 8, wherein the ion comprises P-type ion.

11. The method according to claim 8, wherein the ion comprises an N-type ion.

12. The method according to claim 8, wherein the first polysilicon layer has a thickness of about 200–400 Å.

* * * * *